(12) United States Patent
Meehleder et al.

(10) Patent No.: US 9,885,755 B2
(45) Date of Patent: Feb. 6, 2018

(54) LOAD CENTER MONITOR WITH OPTICAL WAVEGUIDE SHEET

(71) Applicant: SCHNEIDER ELECTRIC USA, INC., Schaumburg, IL (US)

(72) Inventors: Steve M. Meehleder, Cedar Rapids, IA (US); Jeffrey O. Sharp, Murfreesboro, TN (US)

(73) Assignee: SCHNEIDER ELECTRIC USA, INC., Andover, MA (US)

( * ) Notice: Subject to any disclaimer, the term of this patent is extended or adjusted under 35 U.S.C. 154(b) by 17 days.

(21) Appl. No.: 15/023,705

(22) PCT Filed: Sep. 26, 2013

(86) PCT No.: PCT/US2013/061886
§ 371 (c)(1),
(2) Date: Mar. 22, 2016

(87) PCT Pub. No.: WO2015/047269
PCT Pub. Date: Apr. 2, 2015

(65) Prior Publication Data
US 2016/0231383 A1  Aug. 11, 2016

(51) Int. Cl.
*G01R 31/333* (2006.01)
*G01D 5/26* (2006.01)
(Continued)

(52) U.S. Cl.
CPC ......... *G01R 31/3333* (2013.01); *G01D 5/268* (2013.01); *G01R 19/0092* (2013.01);
(Continued)

(58) Field of Classification Search
CPC ............ G01R 31/3333; G01R 31/3277; G01R 19/2513; G01R 19/0092; G01D 5/268
(Continued)

(56) References Cited

U.S. PATENT DOCUMENTS 4,969,063 A   11/1990   Scott et al.
5,162,664 A   11/1992   Haun et al.
(Continued)

FOREIGN PATENT DOCUMENTS

EP          0119042          9/1984
JP      2006285291 A  *  10/2006

OTHER PUBLICATIONS

Extended European Search Report for Application No. 13894911.0-1804 / 3050186 PCT/US2013061886 dated Apr. 13, 2017.
(Continued)

*Primary Examiner* — Jermele M Hollington
*Assistant Examiner* — Christopher McAndrew
(74) *Attorney, Agent, or Firm* — Locke Lord LLP

(57) ABSTRACT

An optical waveguide sheet 50 is fastened to an inward facing access door 4 of the load center 2. When the door is closed, the optical waveguide sheet is positioned so that one portion is juxtaposed with the circuit breaker 10A in the load center, to enable the optical waveguide sheet to receive an optical signal 70A characterizing current in the circuit breaker. The optical waveguide sheet 50 is further positioned so that another portion is juxtaposed with an optical window 48 of an aggregator. The optical waveguide sheet is configured to internally reflect the optical signal 70A within its body and to conduct the internally reflected optical signal from the circuit breaker to the optical window of the aggregator. The aggregator may provide information characterizing current usage to an alarm, a measurement device, the smart grid, or a storage device for later use.

11 Claims, 4 Drawing Sheets

(51) Int. Cl.
*G01R 19/00* (2006.01)
*G01R 19/25* (2006.01)
*H04Q 9/00* (2006.01)
*H02H 1/00* (2006.01)
*G01R 31/327* (2006.01)

(52) U.S. Cl.
CPC ........... *G01R 19/2513* (2013.01); *H04Q 9/00* (2013.01); *G01R 31/3277* (2013.01); *H02H 1/0069* (2013.01); *H04Q 2209/60* (2013.01); *Y02P 80/11* (2015.11)

(58) Field of Classification Search
USPC ......................................................... 324/424
See application file for complete search history.

(56) References Cited

U.S. PATENT DOCUMENTS

| | | | |
|---|---|---|---|
| 5,196,982 A | 3/1993 | Landsberg et al. | |
| 5,343,192 A | 8/1994 | Yenisey | |
| 5,821,876 A | 10/1998 | Farrington et al. | |
| 5,831,500 A * | 11/1998 | Turner | H01H 71/04 200/400 |
| 5,877,691 A | 3/1999 | Suptitz et al. | |
| 5,892,430 A | 4/1999 | Weisman | |
| 5,982,596 A * | 11/1999 | Spencer | H02H 3/04 361/102 |
| 6,842,325 B2 | 1/2005 | Meehleder et al. | |
| 7,436,641 B2 | 10/2008 | Holley | |
| 7,453,267 B2 * | 11/2008 | Westbrock, Jr. | H02H 1/0038 324/142 |
| 8,111,146 B2 * | 2/2012 | Touge | B60Q 9/00 340/436 |
| 8,111,148 B2 * | 2/2012 | Parker | H04B 10/802 340/538 |
| 8,666,685 B2 | 3/2014 | Paik et al. | |
| 2001/0052843 A1 | 12/2001 | Wiesman et al. | |
| 2003/0053279 A1 | 3/2003 | Meehleder et al. | |
| 2004/0178875 A1 | 9/2004 | Saito | |
| 2006/0228068 A1 * | 10/2006 | Ouchi | G02B 6/4214 385/14 |
| 2008/0077336 A1 * | 3/2008 | Fernandes | G01R 15/142 702/57 |
| 2010/0164744 A1 * | 7/2010 | Parker | H04B 10/802 340/12.22 |
| 2010/0235122 A1 | 9/2010 | McCrea et al. | |
| 2011/0102958 A1 * | 5/2011 | Meehleder | H02H 1/06 361/93.1 |
| 2012/0086433 A1 | 4/2012 | Cheng et al. | |
| 2013/0021162 A1 * | 1/2013 | DeBoer | B60L 11/1824 340/635 |
| 2013/0021163 A1 * | 1/2013 | Watford | H02H 3/04 340/638 |
| 2013/0200971 A1 | 8/2013 | Crutcher et al. | |
| 2014/0015516 A1 | 1/2014 | Sorensen et al. | |
| 2014/0092627 A1 | 4/2014 | Nakashima et al. | |
| 2014/0218889 A1 | 8/2014 | Kwak | |
| 2015/0002138 A1 | 1/2015 | Fox | |

OTHER PUBLICATIONS

International Search Report and Written Opinion dated Feb. 28, 2014 in PCT/US2013/061886, 15 pages.
George W. Benthien, "Digital Enlcoding and Decoding," Aug. 13, 2007, http://gbenthien.net/encoding.pdf, 22 pages.

* cited by examiner

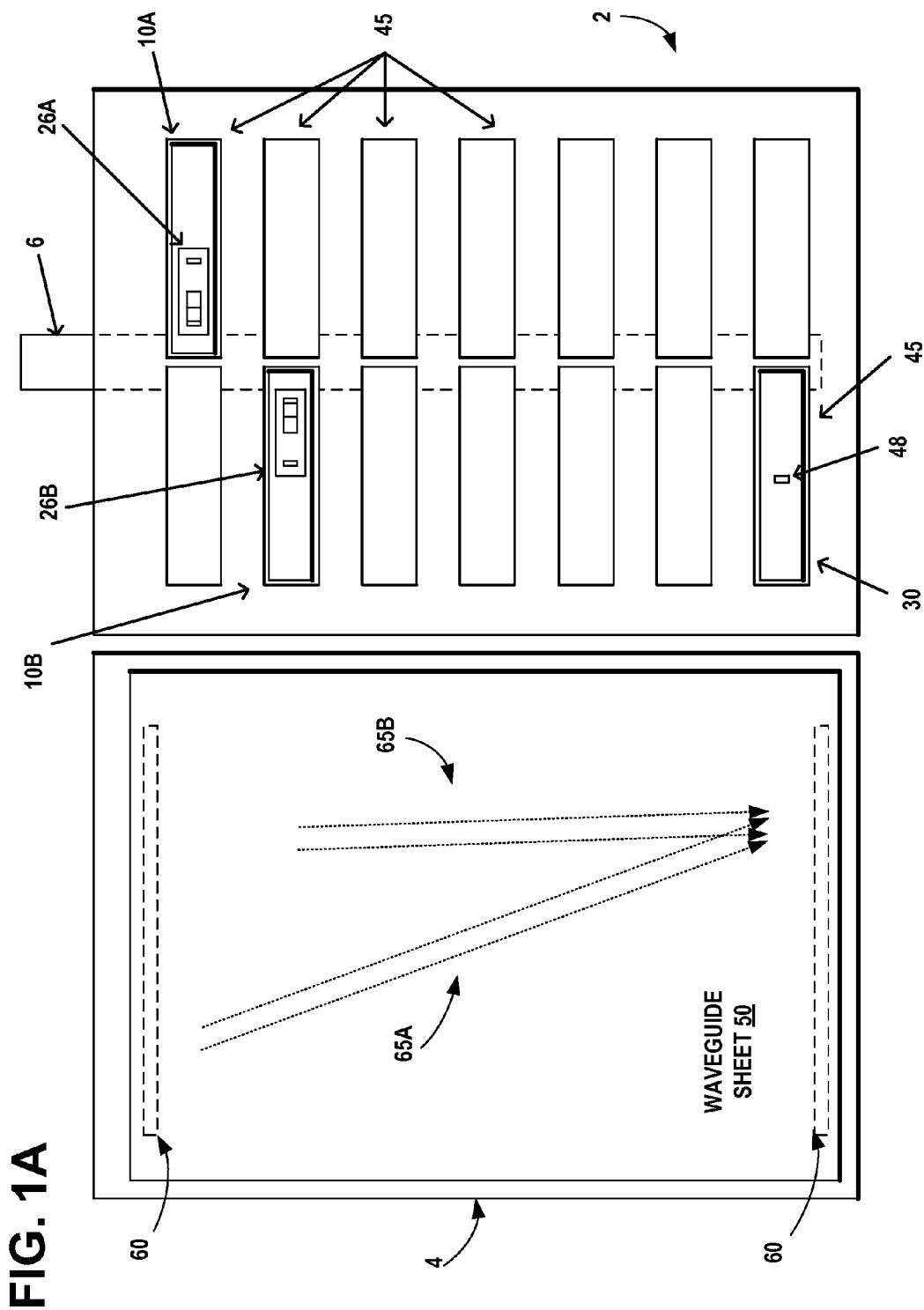

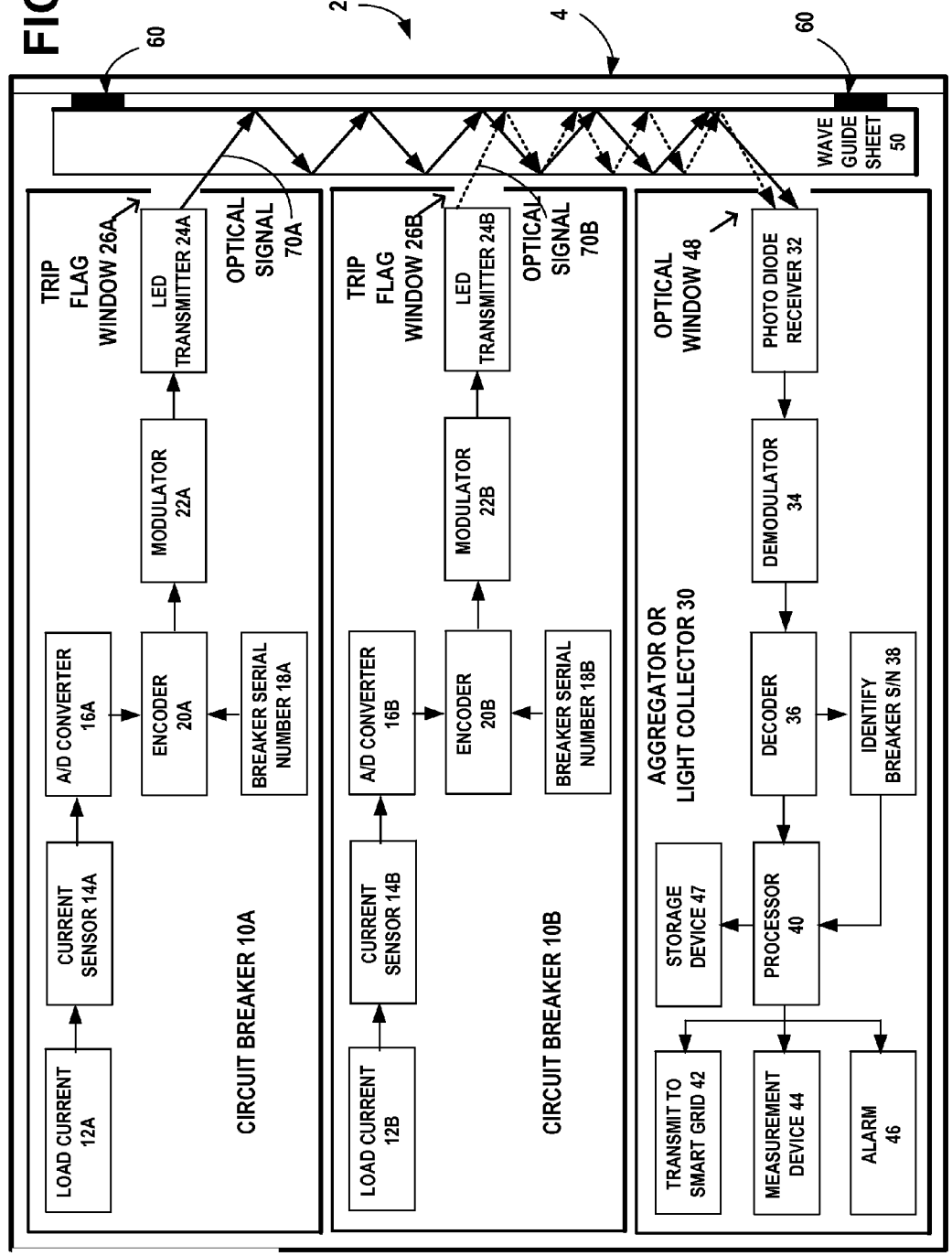

LOAD CENTER MONITOR WITH OPTICAL WAVEGUIDE SHEET

FIELD OF THE INVENTION

The invention disclosed broadly relates to monitoring electrical energy demand in a load center.

BACKGROUND OF THE INVENTION

In order to create a Smart Grid infrastructure to better manage energy resources, it will be necessary to monitor and measure energy demand at the individual points of consumption, in homes, at places of business, and at industrial sites. The focal point for electrical power distribution in homes, businesses, and factories is the load center, where the branch circuits are organized with branch circuit breakers occupying branch location slots in the load center, and connected through the circuit breakers to an incoming main power bus. The load center is one location for installing the capability to monitor and measure energy demand.

The universal installation of energy monitoring equipment in homes, businesses, and factories should be simple, practical, and affordable. In the prior art, branch circuit monitoring systems required the installation of current transformers and wiring or multiple, miniature circuit boards in the load center, fastening each current transformer or circuit board to each individual branch circuit line. Such a solution is not necessarily simple, practical, nor inexpensive for a retrofit within the confines of the load center enclosure.

SUMMARY OF THE INVENTION

The invention provides simple, practical, and relatively inexpensive equipment to convert a load center in a home, business, or factory, to enable energy monitoring for a Smart Grid infrastructure. The invention requires no rewiring to the load center itself, where space is already at a premium, when using current sensing circuit breakers. Instead, an optical waveguide sheet is fastened, for example by magnets, to the inside facing surface of the access door of the load center. When the access door is closed, the optical waveguide sheet receives optical signals from individual circuit breakers through their respective light emitters. The optical signals characterize the current sensed by a current sensor in each circuit breaker. Each optical signal carries identification information to identify the circuit breaker transmitting the optical signal. The optical waveguide sheet is configured to internally reflect the optical signals within the body of the optical waveguide sheet. An aggregator or light collector circuit is mounted in a circuit breaker branch location slot in the load center. The aggregator or light collector circuit includes an optical receiver that is configured to receive the optical signal from the optical waveguide sheet. The aggregator or light collector circuit includes an identifier circuit to identify which circuit breaker transmitted the received optical signal, based on the identification information in the received optical signal. The aggregator or light collector circuit may be configured to provide information characterizing the current sensed in each circuit breaker, to at least one of an alarm, a measurement device, the Smart Grid, or a storage device for later use in the simplest case.

BRIEF DESCRIPTION OF THE DRAWINGS

Example embodiments of the invention are depicted in the accompanying drawings that are briefly described as follows:

FIG. 1A illustrates an example embodiment of the invention, showing a load center with an optical waveguide sheet fastened, for example by magnets, to the inside facing surface of the access door of the load center. Branch circuits are organized with branch circuit breakers occupying branch location slots in the load center, and connected through the circuit breakers to an incoming main power bus. An aggregator or light collector circuit is mounted in a circuit breaker branch location slot in the load center. Example light paths are shown in the optical waveguide sheet.

FIG. 3 illustrates the example embodiment of the invention shown in FIG. 1B, showing the access door closed and the optical waveguide sheet internally reflecting the optical signals from the circuit breakers to the aggregator circuit. The figure further shows various example components in each circuit breaker, to encode the optical signal with identification information to identify the circuit breaker transmitting the optical signal. The figure further shows various example components in the aggregator circuit, to identify which circuit breaker transmitted the received optical signal, based on the identification information in the received optical signal.

DETAILED DESCRIPTION OF THE EXAMPLE EMBODIMENTS

Figure 1B:
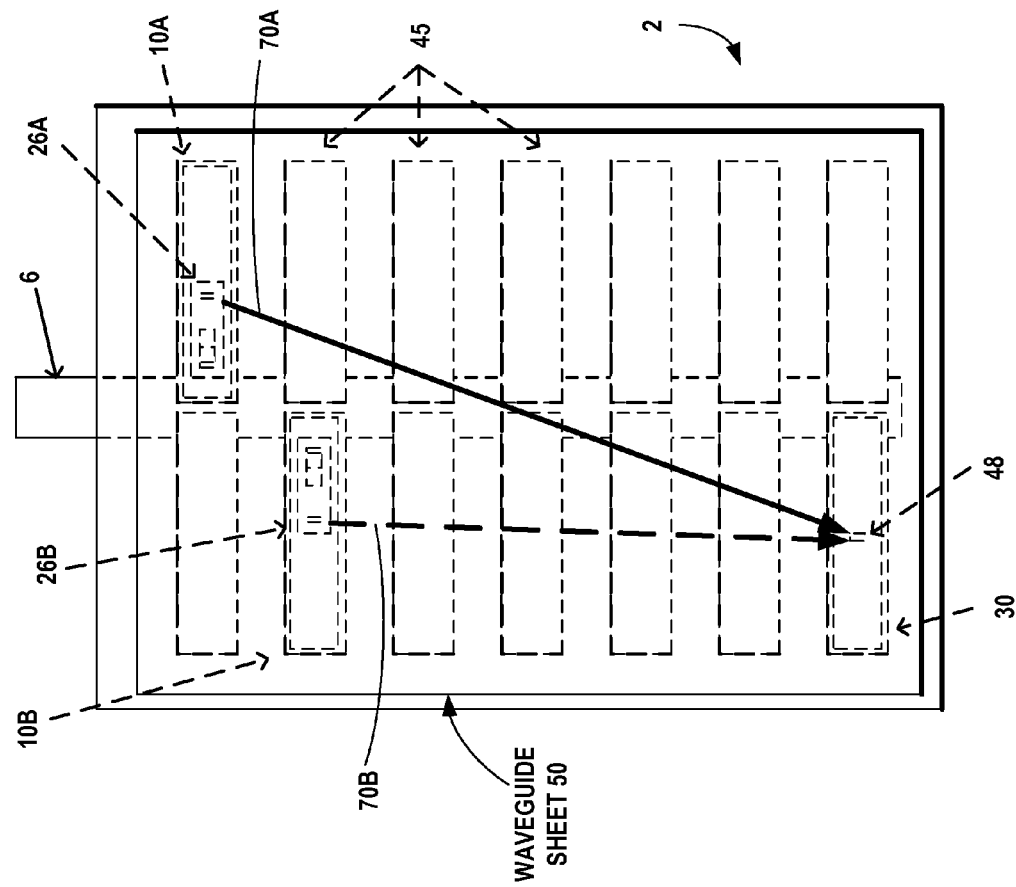
FIG. 1B illustrates the example embodiment of the invention shown in FIG. 1A, showing the access door closed and the optical waveguide sheet receiving optical signals from individual circuit breakers through their respective trip flag windows. The optical signals characterize the load current sensed by a current sensor in each circuit breaker. The optical waveguide sheet is shown internally reflecting the optical signals to the aggregator circuit.

The invention provides simple, practical, and relatively inexpensive equipment to convert a load center in a home, business, or factory, to enable energy monitoring for a Smart Grid infrastructure. The invention requires no rewiring to the load center, itself, where space is already at a premium.

FIG. 1A illustrates an example embodiment of the invention, showing a load center 2 with an optical waveguide sheet 50 fastened, for example by magnets 60, to the inside facing surface of the access door 4 of the load center 2. In addition to magnets 60, other types of suitable fasteners may be used to hold the waveguide sheet 50 to the door 4, including, for example, adhesives, screws, pins, and slotted guides fitting the edges of the waveguide sheet. In an example embodiment of the invention, the optical waveguide sheet 50 may be planar and composed of optical glass or optical quality thermoplastic capable of conducting visible or infrared light, for example a polycarbonate or silicone, having an example thickness on the order of 1 mm. Example light paths 65A and 65B are shown in the optical waveguide sheet 50.

Branch circuits may be organized with branch circuit breakers 10A and 10B occupying branch location slots 45 in the load center 2, and connected through the circuit breakers 10A and 10B to an incoming main power bus 6. Each circuit breaker 10A and 10B may include a respective trip flag window 26A and 26B that is used to display a visible flag when the breaker is in the tripped position, as known in the art. In an example embodiment of the invention, the trip flag window 26A and 26B is designed and equipped to also be used as a port through which an optical signal may be transmitted by an optical transmitting device, such as a light emitting diode (LED), located inside the circuit breaker. Other example embodiments are possible, for example where the optical transmitting device may otherwise be incorporated into the breaker and it's light emitter located preferably on the front surface 13 (FIG. 2) of the breaker so as to face the wave guide sheet 50. The circuit breakers 10A and 10B, typically occupying branch location slots in a load center 2, may include breakers with integral current measurement functions such ground fault interrupters, arc fault breakers, and breakers that have combinations of arc fault, and ground fault functionality.

An aggregator or light collector circuit 30 occupies a circuit breaker branch location slot 45 in the load center 2. The aggregator circuit 30 may include an optical window 48 that may be used as a port through which an optical signal may be received by an optical receiving device, such as a photo diode receiver located inside the aggregator 30.

FIG. 1B illustrates the example embodiment of the invention shown in FIG. 1A, showing the access door 4 closed and the optical waveguide sheet 50 receiving optical signals 70A and 70B, from individual circuit breakers 10A and 10B, respectively, through their respective trip flag windows 26A and 26B. The optical signals 70A and 70B characterize the load current sensed by a current sensor in each respective circuit breaker 10A and 10B. The optical waveguide sheet 50 is shown internally reflecting the optical signals 70A and 70B from the trip flag windows 26A and 26B to the optical window 48 of the aggregator, i.e. light collector, circuit 30. The internally reflected optical signals 70A and 70B propagate along the respective example light paths 65A and 65B shown in the optical waveguide sheet 50 of FIG. 1A.

Figure 2:
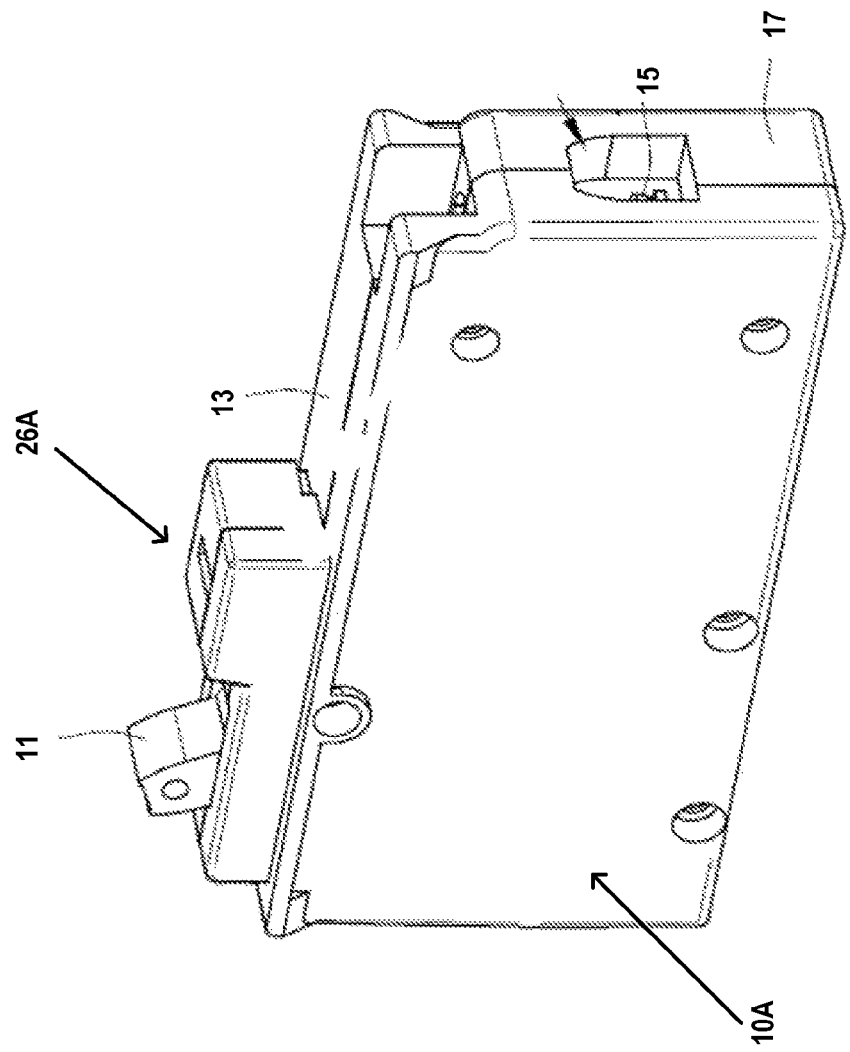
FIG. 2 illustrates the example embodiment of a circuit breaker that includes a trip flag window.

FIG. 2 illustrates the example embodiment of a circuit breaker 10A that includes a trip flag window 26A that may be used as a port through which an optical signal may be transmitted by an optical transmitting device, such as a light emitting diode (LED), located inside the circuit breaker 10A. Other example embodiments are possible, for example where the optical transmitting device may be located outside of the circuit breaker in an add on module that bolts onto the back of the circuit breaker and can communicate through the optical waveguide sheet. The figure also shows the handle 11, front face 13, load terminal 15, and bottom side 17 of the circuit breaker 10A.

FIG. 3 illustrates the example embodiment of the invention shown in FIG. 1B, showing the access door 4 closed and the optical waveguide sheet 50 internally reflecting the optical signals 70A and 70B from the respective circuit breakers 10A and 10B, to the aggregator or light collector circuit 30. The optical waveguide sheet 50 is positioned so that one portion of it is juxtaposed with the optical transmitter 24A of the circuit breaker 10A, for example the trip flag window 26A of the circuit breaker 10A, to enable the optical waveguide sheet 50 to receive the optical signal 70A transmitted by an LED transmitter 24A in the circuit breaker 10A. The optical waveguide sheet 50 is also positioned so that one portion of it is juxtaposed with the optical transmitter 24B of the circuit breaker 10B, for example the trip flag window 26B of the circuit breaker 10B, to enable the optical waveguide sheet 50 to receive the optical signal 70B transmitted by an LED transmitter 24B in the circuit breaker 10B.

The optical signals 70A and 70B incident on the waveguide sheet 50, referred to here as the incident light, that is emitted through the respective trip flag windows 26A and 26B of the circuit breakers 10A and 10B, may be directed into the waveguide sheet 50, to become totally internally reflected optical signals that generally propagate in two dimensions within the planar waveguide sheet 50. Optionally, suitable reflective surfaces may be respectively positioned on the opposite side of the waveguide sheet 50 from where the optical signals 70A and 70B, the incident light from the trip flag windows 26A and 26B, enter the waveguide sheet 50, to increase the proportion of the incident light having an angle of propagation greater than the critical angle within the waveguide sheet 50.

The planar waveguide sheet 50 may be composed of an optically conductive medium, having an index of refraction n1. The waveguide sheet 50 may be coated with a transparent cladding having a lower index of refraction n2 or it may be merely clad with ambient air, also having a lower index of refraction n2. Snell's Law says that at one particular angle, the critical angle, a light ray within the waveguide sheet 50 will not be transmitted into the cladding of lower index n2, but instead will travel along the surface of the waveguide sheet 50 between the two media. Snell's law may be expressed as the sine of the critical angle equaling the ratio of n2/n1, where n1 and n2 are the indices of refraction and n1 is greater than n2. If the light ray through the waveguide sheet 50 is greater than the critical angle, then the refracted light ray will be reflected entirely back into the waveguide sheet 50, that is, it will be totally internally reflected, even though the cladding or air may be transparent. In the waveguide sheet 50, the light rays travel through the waveguide sheet 50 by reflecting from the lower index of refraction cladding, because the angle of the light is greater than the critical angle.

The optical waveguide sheet 50 may be further positioned so that a portion is juxtaposed with the optical window 48 of the aggregator circuit 30. The optical signals 70A and 70B exiting the waveguide sheet 50, referred to here as the exiting light, and entering the optical window 48 of the aggregator circuit 30, may be directed out of the waveguide sheet 50 and into the optical window 48. Optionally, a suitable reflective surface may be positioned on the opposite side of the waveguide sheet 50 from where the optical signals 70A and 70B exit the waveguide sheet 50, the exiting light into the optical window 48 of the aggregator circuit 30, to increase the proportion of the optical signals 70A and 70B exiting from the waveguide sheet 50.

The figure further shows various example components in each circuit breaker 10A and 10B, to encode the optical signal with identification information to identify the circuit breaker transmitting the optical signal. In circuit breaker 10A, the current 12A, which may be the load current, is sensed by the current sensor 14A, that may be a current transformer, Hall-effect device, or other type of sensor. The sensing signal output from the current sensor 14A may be an analog signal that is sampled and converted into a digital value by the analog-to-digital (A/D) converter 16A and the digital value then input to the encoder 20A. The circuit breaker's serial number 38A, or other form of identification, is also input to the encoder 20A. The encoder 20A combines these values to generate a combined signal that includes the identification information of the circuit breaker 10A and a value characterizing the current sensed by the current sensor 14A. The combined signal is input to the modulator 22A and the modulated signal is applied to the signal input of the LED transmitter 24A. The optical signal 70A is then output from the LED transmitter 24A, modulated with identification information of the circuit breaker 10A and a value characterizing the current sensed by the current sensor 14A. Similar components and operation are included the circuit breaker 10B. In addition to the load current 12A, line current, line voltage, ground fault current, and circuit parameters derived or synthesized from the sensors in the circuit breaker, may be monitored and communicated.

The figure further shows various example components in the aggregator circuit 30, to identify which circuit breaker 10A or 10B has transmitted the received optical signal 70A or 70B, based on the identification information in the received optical signal from the sending circuit breaker. The aggregator circuit 30 includes a photo diode receiver 32 that receives the optical signals 70A and 70B exiting the waveguide sheet 50. The electrical signal output from the photo diode receiver 32, is demodulated in the demodulator 34 and the digital electrical signal output by the demodulator, is input to the decoder 36. The decoded signal output from the decoder 36 includes an identification signal that includes the identification information indicating which circuit breaker sent the signal and a value characterizing the current sensed by the current sensor. The breaker identifier circuit 38 identifies the circuit breaker and that identity is output to the processor 40. The decoder 36 outputs to the processor 40 the value characterizing the current sensed by the current sensor. The aggregator circuit 30 may provide the decoded optical signal to at least one of an alarm 46, a measurement device 44, or a storage device 47 for later use, or it may transmit the received current signal to a smart grid by means of a transmitter 42. It is envisioned that the storage device could be a Sandisk™ or other removable and portable storage device for use by the owner of the load center, in a basic retrofit embodiment requiring no extra communications wiring of the load center. The transmitter 42 may be a wireless transmitter or a wireline transmitter.

Although specific example embodiments of the invention have been disclosed, persons of skill in the art will appreciate that changes may be made to the details described for the specific example embodiments, without departing from the spirit and the scope of the invention.

The invention claimed is:

1. A load center monitor, comprising:
   a circuit breaker mounted in a load center and electrically connected to an electrical distribution bus, the circuit breaker including a current sensor being configured to sense a current conducted by the circuit breaker, the circuit breaker including an optical transmitter coupled to the current sensor, the optical transmitter being configured to transmit an optical signal outside of the circuit breaker, the optical signal characterizing the current sensed by the current sensor, the optical signal carrying identification information to identify the circuit breaker;
   an aggregator mounted in the load center, the aggregator including an optical receiver being configured to receive the optical signal through an optical window of the aggregator, the aggregator further including an identifier circuit coupled to the optical receiver, the identifier circuit being configured to identify a circuit breaker that transmitted the received optical signal, based on the identification information in the received optical signal; and
   an optical waveguide sheet being fastened to an inward facing access door of the load center so that when the access door is closed, the optical waveguide sheet is positioned so that one portion thereof is juxtaposed with the optical transmitter of the circuit breaker to enable the optical waveguide sheet to receive the optical signal transmitted by the optical transmitter in the circuit breaker, the optical waveguide sheet being further positioned so that another portion thereof is juxtaposed with the optical window of the aggregator, the optical waveguide sheet being configured to conduct the internally reflected optical signal from the optical transmitter of the circuit breaker to the optical window of the aggregator, to provide the received optical signal in the aggregator.

2. The load center monitor of claim 1, further comprising:
   wherein the circuit breaker and the aggregator are mounted in circuit breaker branch location slots of the load center.

3. The load center monitor of claim 1, further comprising:
   wherein optical waveguide sheet is mounted on the inward facing surface of the access door of the load center, by means of at least one of magnets, adhesives, screws, pins, and slotted guides fitting edges of the waveguide sheet.

4. The load center monitor of claim 1, further comprising:
   wherein the optical waveguide sheet is composed of polycarbonate or silicone.

5. The load center monitor of claim 1, further comprising:
   wherein the circuit breaker further includes an encoder coupled to an output of the current sensor and coupled to an input to the optical transmitter, the encoder being configured to generate a combined signal that includes the identification information of the circuit breaker and a value characterizing the current sensed by the current sensor.

6. The load center monitor of claim 1, further comprising:
   wherein the aggregator further includes a decoder coupled an output of the optical receiver and coupled to an input to the identifier circuit, the decoder being configured to generate an identification signal that includes the identification information of the circuit breaker and a value characterizing the current sensed by the current sensor.

7. The load center monitor of claim 1, further comprising:
   wherein the aggregator further includes a decoder coupled an output of the optical receiver, the decoder being configured to generate a decoded optical signal that includes a value characterizing the current sensed by the current sensor, the aggregator being further configured to provide the decoded optical signal to at least one of an alarm, a measurement device, a smart grid, and a storage device for later use.

8. The load center monitor of claim 1, further comprising:
   wherein the optical transmitter may be located at a window in the circuit breaker or outside of the circuit breaker.

9. The load center monitor of claim 1, further comprising:
   wherein the current sensed by the current sensor is at least one of a load current, a line current, a ground fault current, and circuit parameters derived or synthesized from the current sensor in the circuit breaker.

10. The load center monitor of claim 7, wherein the storage device is a removable and portable storage device.

11. A load center monitor, comprising:
    a circuit breaker mounted in a load center and electrically connected to an electrical distribution bus, the circuit breaker including a current sensor being configured to sense a current conducted by the circuit breaker, the circuit breaker including an optical transmitter coupled to the current sensor, the optical transmitter being configured to transmit an optical signal outside of the circuit breaker, the optical signal characterizing the current sensed by the current sensor, the optical signal carrying identification information to identify the circuit breaker;
    an aggregator mounted in the load center, the aggregator including an optical receiver being configured to receive the optical signal through an optical window of the aggregator, the aggregator further including an identifier circuit coupled to the optical receiver, the identifier circuit being configured to identify a circuit breaker that transmitted the received optical signal, based on the identification information in the received optical signal; and an optical waveguide being positioned so that one portion thereof is juxtaposed with the optical transmitter of the circuit breaker to enable the optical waveguide to receive the optical signal transmitted by the optical transmitter in the circuit breaker, the optical waveguide being further positioned so that another portion thereof is juxtaposed with the optical window of the aggregator, the optical waveguide being configured to conduct the internally reflected optical signal from the optical transmitter of the circuit breaker to the optical window of the aggregator, to provide the received optical signal in the aggregator.

\* \* \* \* \*